United States Patent
Cording et al.

(10) Patent No.: US 8,273,595 B2
(45) Date of Patent: Sep. 25, 2012

(54) SILICON THIN FILM DEPOSITION FOR PHOTOVOLTAIC DEVICE APPLICATIONS

(75) Inventors: Christopher R. Cording, Kingsport, TN (US); Matthew Spencer, Gray, TN (US); Kunio Masumo, Zama (JP)

(73) Assignees: AGC Flat Glass North America, Inc., Alpharetta, GA (US); Asahi Glass Co., Ltd., Tokyo (JP)

(*) Notice: Subject to any disclaimer, the term of this patent is extended or adjusted under 35 U.S.C. 154(b) by 176 days.

(21) Appl. No.: 12/755,712

(22) Filed: Apr. 7, 2010

(65) Prior Publication Data
US 2010/0255627 A1 Oct. 7, 2010

Related U.S. Application Data

(60) Provisional application No. 61/167,349, filed on Apr. 7, 2009.

(51) Int. Cl.
*H01L 21/00* (2006.01)
(52) U.S. Cl. ............ 438/62; 438/479; 257/E21.09
(58) Field of Classification Search .......... 438/62, 438/479; 257/E21.09
See application file for complete search history.

(56) References Cited

U.S. PATENT DOCUMENTS

| 4,907,052 | A | 3/1990 | Takada et al. |
| 5,764,415 | A | 6/1998 | Nelson et al. |
| 2006/0134322 | A1 | 6/2006 | Harris et al. |
| 2007/0215205 | A1 | 9/2007 | Thomsen et al. |

OTHER PUBLICATIONS

PCT International Search Report, issued in PCT/US 10/30199 on Jun. 16, 2010, 14 pages.

*Primary Examiner* — Alexander Ghyka
*Assistant Examiner* — Stanetta Isaac
(74) *Attorney, Agent, or Firm* — Rothwell, Figg, Ernst & Manbeck, P.C.

(57) ABSTRACT

The present invention provides for cost-efficient methods for on-line deposition of semi-conducting metallic layers. More specifically, the present invention provides on-line pyrolytic deposition methods for deposition of p-type, n-type and i-type semi-conducting metallic layers in the float glass production process. Furthermore, the present invention provides for on-line pyrolytic deposition methods for production of single-, double-, triple- and multi-junction p-(i-)n and n-(i-)p type semi-conducting metal layers. Such p-type, n-type and i-type semi-conducting metal layers are useful in the photovoltaic industry and attractive to manufacturers of photovoltaic modules as "value-added" products.

62 Claims, 7 Drawing Sheets

SILICON THIN FILM DEPOSITION FOR PHOTOVOLTAIC DEVICE APPLICATIONS

CROSS-REFERENCE TO RELATED APPLICATION

This application claims the benefit of U.S. Provisional Application No. 61/167,349, filed Apr. 7, 2009, which is hereby incorporated by reference in its entirety into the present application.

BACKGROUND OF THE INVENTION

1. Field of the Invention

The present invention relates generally to silicon based thin film deposition for use in photovoltaic (PV) devices and methods of making the same. More particularly, the invention relates to improved methods for increasing the efficiency of the deposition of silicon based thin films on photovoltaic substrates.

2. Discussion of the Background

All United States and Foreign Patents and Published Patent Applications referred to herein are hereby incorporated by reference in their entireties. In the case of conflict, the present specification, including definitions, will control.

Of the alternative sources, the sun is considered the most abundant natural resource, with an infinite supply of energy showering the Earth on a daily basis. Numerous technologies exist that are directed to capturing the sun's light energy and converting it into electricity. A photovoltaic (PV) module represents such a technology and, to date, has found many applications in areas such as remote power systems, space vehicles and consumer products, such as wireless devices.

A photovoltaic module, or device, functions because of the photoelectric effect. The photoelectric effect of PV devices can be realized by the utilization of semiconducting materials such as silicon (Si), gallium arsenide (GaAs), cadmium sulfide (CdS), cadmium telluride (CdTe), copper indium diselenide ($CuInSe_2$, also referred to as CIS) and copper indium gallium diselenide ($CuInGaSe_2$, also referred to as CIGS). Of these materials, silicon is most frequently used in photovoltaic devices because of: 1) its availability; and 2) its lower cost as compared to the materials GaAs, CdS, CdTe, CIS and CIGS. However, to date, silicon based PV devices have been found to be less efficient than those based on GaAs, CdS, CdTe, CIS and CIGS.

PV modules are known to incorporate PV substrates, such as glass, coated with thin films. Thin film photovoltaics further incorporate a transparent front conductor, usually also a thin film. The most common conductive thin films used are transparent conductive oxides (TCO) such as tin oxide, fluorine-doped tin oxide (FTO), aluminum-doped zinc oxide (AZO) and indium tin oxide (ITO). The main function of a TCO is two-fold. First, the TCO allows light to pass through to an active light absorbing material beneath it. Second, the TCO serves as an ohmic contact to transport photo-generated charges away from the light absorbing material. Such TCOs are desirable for all types of photovoltaic and solar modules, and are especially desirable for photovoltaic modules based on silicon.

Photovoltaic thin films on glass are desirable for numerous reasons. Glass is omnipresent and, as such, provides an existing infrastructure for deployment of PV thin films. Additionally, glass production methods are well known. One such well known glass production method is the float-line method for producing float, or flat, glass. As a result of this desirability for thin films on glass, many methods exist for producing thin film coatings on glass. One of these existing methods is known as "on-line" deposition, wherein a coating apparatus is disposed either in a tin bath of a float-line or downstream of a tin bath of a float-line.

Typically, PV module manufacturers purchase PV substrates that include, for example, the generic structure: glass-substrate/undercoating (UC)/TCO. More specifically, a glass substrate with an undercoating of silicon oxycarbide and a TCO layer of fluorine doped tin oxide, wherein both the undercoating and the TCO layers are deposited pyrolytically in an on-line process.

After obtaining PV module substrates such as those described in the preceding paragraph, a myriad of processing steps must be undertaken to realize the final PV module. Process steps needed for deposition of the semiconducting thin films include, but are not limited to: A) cleaning and washing of the PV module substrate prior to deposition of semi-conductor thin film layers; B) re-heating and re-cooling of the PV module substrate prior to deposition of semiconductor thin film layers; and C) deposition of semiconductor thin film layers. After deposition of the semiconducting thin film layers, further processing steps are required to arrive at the final PV module. These steps include, but are not limited to: D) laser scribing of the silicon layers to form individual PV cells; E) forming a back contact; F) laminating the PV module; G) wiring of the PV module; H) potting of the PV module; and I) testing of the PV module.

The process steps described above with respect to the deposition of the semiconducting thin films impart large amounts of production time and cost associated with the production of PV modules. The amount of time and cost required by the semiconductor thin film deposition steps is one of the major obstacles that hinder electricity generated from PV modules from being economically competitive with electricity generated from fossil fuels. To date, it costs well over $3/peak-Watt (pW) for electricity generated from silicon thin film based PV modules.

While photovoltaics have found many uses, there still exists a number of obstacles to overcome before electricity generated from PV modules can be competitive with electricity generated from traditional fossil fuels. Along these lines, PV module manufacturing costs represent the biggest obstacle preventing electricity generated from PV modules from being competitive with electricity generated from traditional fossil fuels.

Thus, there remains a need in the art for PV module production methods that can overcome the above-noted problems of manufacturing PV modules. In particular, there is a need in the art for PV modules that can be manufactured in a more cost-efficient manner.

SUMMARY OF THE INVENTION

The present invention provides methods for deposition of silicon thin films on PV module substrates.

In an aspect of the invention, there is provided methods for the pyrolytic deposition of silicon thin films on PV module substrates.

In an aspect of the invention, there is provided methods for the on-line pyrolytic deposition of silicon thin films on PV module substrates.

In an aspect of the invention, there is provided methods for the on-line pyrolytic deposition of amorphous silicon thin films on PV module substrates.

In another aspect of the invention, there is provided methods for the on-line pyrolytic deposition of crystalline silicon thin films on PV module substrates.

In another aspect of the invention, there is provided methods for the on-line pyrolytic deposition of positive-type silicon (p-Si) thin film layers on PV module substrates.

In another aspect of the invention, there is provided methods for the on-line pyrolytic deposition of intrinsic-type, or un-doped, silicon (i-Si) thin film layers on PV module substrates.

In another aspect of the invention, there is provided methods for the on-line pyrolytic deposition of negative-type silicon (n-Si) thin film layers on PV module substrates.

In another aspect of the invention, there is provided methods for the on-line pyrolytic deposition of single-junction p-n silicon thin film layers on PV module substrates.

In another aspect of the invention, there is provided methods for the on-line pyrolytic deposition of single-junction n-p silicon thin film layers on PV module substrates.

In another aspect of the invention, there is provided methods for the on-line pyrolytic deposition of single-junction p-i-n silicon thin film layers on PV module substrates.

In another aspect of the invention, there is provided methods for the on-line pyrolytic deposition of single-junction n-i-p silicon thin film layers on PV module substrates.

In yet another aspect of the invention, there is provided methods for on-line the pyrolytic deposition of multi-junction p-n silicon thin film layers on PV module substrates.

In yet another aspect of the invention, there is provided methods for the on-line pyrolytic deposition of multi-junction n-p silicon thin film layers on PV module substrates.

In yet another aspect of the invention, there is provided methods for the on-line pyrolytic deposition of multi-junction p-i-n silicon thin film layers on PV module substrates.

In yet another aspect of the invention, there is provided methods for the on-line pyrolytic deposition of multi-junction n-i-p silicon thin film layers on PV module substrates.

In yet another aspect of the invention, there is provided a "value-added" PV module substrate product made by on-line deposition methods described herein.

DETAILED DESCRIPTION OF THE INVENTION

While the present invention may be embodied in many different forms, a number of illustrative embodiments are described herein with the understanding that the present disclosure is to be considered as providing examples of the principles of the invention and such examples are not intended to limit the invention to preferred embodiments described and/or illustrated herein. The various embodiments are disclosed with sufficient detail to enable those skilled in the art to practice the invention. It is to be understood that other embodiments may be employed, and that structural and logical changes may be made without departing from the spirit or scope of the present invention.

The methods in accordance with the present invention provide PV module substrates, including those of the general formula: glass-substrate/Undercoat Layer/TCO/p-type metal/n-type metal or glass-substrate/Undercoat Layer/TCO/p-type metal/i-type metal/n-type metal. Those of skill in the art will recognize the ordering of p-type metal/n-type metal and p-type metal/i-type metal/n-type metal as a single p-n type junction and a single p-i-n type junction, respectively. The methods in accordance with the present invention are easily adapted and configured to produce double-, triple- and multi-p-(i-)n type junctions. Such adaptations and configurations will be recognized and appreciated by those of skill in the art. The methods in accordance with the present invention are also easily adapted and configured to produce double-, triple- and multi-n-(i-)p type junctions.

Methods in accordance with the present invention can also be adapted to introduce an additional thin film layer, or layers, into the coating structure described above. Such an additional layer(s) may be disposed above or below the metal layers. As a non-limiting example, another undercoating thin film layer may be disposed above the glass substrate and below the metal layers (and below the TCO layer) to form a PV module substrate of the general formula: glass-substrate/Undercoat Layer 1/Undercoat Layer 2/TCO/p-type metal/i-type metal/n-type metal. The choice of the number of undercoatings will be recognized and appreciated by those of skill in the art. As another non-limiting example, another TCO thin film layer may be disposed above or below the first TCO thin film layer to form a PV module substrate of the general formula: glass-substrate/Undercoat Layer/TCO Layer 1/TCO Layer 2/p-type metal/i-type metal//n-type metal. The choice of the number of TCO thin film layers will be recognized and appreciated by those of skill in the art. As yet another non-limiting example, an additional layer or layers may be disposed between the TCO layer and the metal layers. Such an additional layer(s) disposed between the TCO layer and the metal layers is known as an inter-facial layer (IFL) and, when incorporated into PV substrates in accordance with methods of the present invention, can form a PV module substrate of the general formula: glass-substrate/Undercoat Layer/TCO/IFL/p-type metal/i-type metal/n-type metal. Such an IFL(s) can impart mechanical and chemical durability to PV substrates and can also enhance the optical properties of the PV substrate. Known IFLs are based on oxides of titanium, oxides of zinc and combination of oxides of titanium and zinc.

The "undercoat layer," or UC, is a thin film layer that provides the necessary index of refraction for color neutralization and thereby aids in improving the transmittance of a PVTCO module.

The "transparent conductive oxide," or TCO, is a thin film layer that is made from a metal and an oxide. With respect to PV modules, the TCO functions to allow light to pass through to an active light absorbing material beneath it and to serve as an ohmic contact to transport photo-generated charges away from the light absorbing material.

"N-Layer," or a negatively charged layer of semiconducting material, is one that has been chemically combined (i.e., doped) when deposited with a phosphorus, or other Group V element, starting material to make it conductive. It is noted that the n-layer can be passivated with hydrogen. For example, n-type silicon, or n-Si, is a layer of metallic silicon that is doped with a Group V element.

"P-Layer," or a positively charged layer of semiconducting material, is one that has been chemically combined (i.e., doped) when deposited with a boron, or other Group III element, starting material, which turns it into a conductive material that readily accepts electrons. It is noted that p-type silicon can be passivated with hydrogen. For example, p-type silicon, or p-Si, is a layer of metallic silicon that is doped with a Group III element.

"I-Type Silicon," or i-Si, is silicon, or a layer of silicon, that has been deposited without combining it with another chemical. In other words, i-Si is silicon, or a layer of silicon, that is un-doped. I-Si is also referred to as intrinsic-type silicon. It is noted that i-type silicon can be passivated with hydrogen.

"Amorphous silicon," or a-Si, is a non-crystalline allotropic form of silicon. In a-Si, there is no long range crystalline ordering and the atoms form a continuous random network. If desired, the material can be passivated by hydrogen, which reduces interlayer diffusion.

There are several types of "Crystalline silicon," or c-Si. Each is characterized by crystal size such as nanocrystalline silicon (nc-Si), microcrystalline silicon (pc-Si), or polycrystalline.

"P-N junction," or p-n junction, refers to a junction, or contact, formed by combining P-type and N-type semiconductor thin film layers together in very close contact. The term junction refers to the region where the two regions of the semiconductor thin film layers meet.

"P-I-N junction," or p-i-n junction, refers to the basic scenario as follows: A three-layer sandwich is created, with a middle intrinsic (i-type or undoped) layer between an n-type layer and a p-type layer. Similarly, "N-I-P junction," or n-i-p junction, refers to the basic scenario as follows: A three-layer sandwich is created, with a middle intrinsic (i-type or undoped) layer between a p-type layer and an n-type layer. For either scenario, this geometry generates an electric current between the p- and n-type regions. For example, in a p-i-n amorphous silicon (a-Si) cell, the top layer is p-type a-Si, the middle layer is intrinsic silicon, and the bottom layer is n-type a-Si.

"Single-junction" refers to a PV module with a single region of transition between semiconductor layers, such as a p-n junction, which goes from a region that has a high concentration of electron acceptors (p-type) to one that has a high concentration of electron donors (n-type).

"Multi-junction" refers to a PV device containing two or more cell junctions, each of which is optimized for a particular part of the solar spectrum, to achieve greater overall efficiency. This type of structure also referred to as a tandem cell, can achieve higher total conversion efficiency by capturing a larger portion of the solar spectrum.

"Float glass" or "flat glass" refers to glass produced on a float-line by floating a continuous stream of molten glass onto a bath of molten tin. The molten glass spreads onto the surface of the metal and produces a high quality, consistently level sheet of glass.

"Casted glass" or "patterned glass" refers to glass produced by casting a continuous stream of molten glass through casting rolls or by allowing molten glass to solidify in a mold.

"On-line methods" or "on-line" is a term well-known and understood to those in the glass coating arts and, for purposes herein, refers to coating a glass during production of the glass on a glass manufacturing line. This includes but is not limited to float glass and casted glass.

"Off-line methods" or "off-line" is also a term well-known and understood to those in the glass coating arts and, for purposes herein, refers to coating glass after the glass has been produced and removed from a glass manufacturing line.

"Deposited onto" or "deposited on" means that the substance is directly or indirectly applied above the referenced layer. If applied indirectly, one or more layers may intervene. Furthermore, unless otherwise indicated, in describing coatings of the present invention by use of the format "[substance 1]/[substance 2]/[substance 3]/ . . . " or the format "a first [substance 1] layer; a first [substance 2] layer; a second [substance 1] layer; a second [substance 2] layer; . . . ", or the like, it is meant that each successive substance is directly or indirectly deposited onto the preceding substance.

"Peak Watt," or pW, is a measure of power output, most often used in relation to photovoltaic solar energy devices. For a PV electric generating device, its power in watts-peak is defined as the peak output of the device, measured in watts. Thus a 1 pW system will produce 1 W under ideal conditions. Specifically, pWs of a cell is the DC power output in watts as measured under an industry standardized light test before the PV module leaves the manufacturer's facility. The standard light test tests the output power when illuminated under standard conditions of 1000 watts of light intensity per square meter, 25° C. ambient temperature and a spectrum similar to sunlight that has passed through the atmosphere.

Figure 1:
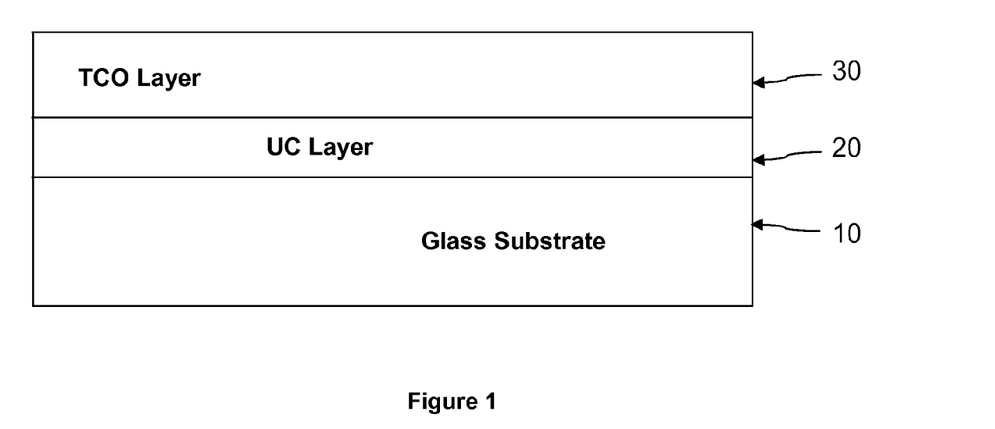
FIG. 1 shows the coating structure of a prior art PV substrate: glass/UC/TCO.

The inventors of the subject matter disclosed herein have surprisingly found that known PV substrates can be subjected to further on-line pyrolytic deposition processes for production of thin film layers based on silicon. Furthermore, such a surprising finding allows for production of a PV substrate that can be considered a "value-added" product for purchase by PV module manufacturers. FIG. 1 depicts such a known PV substrate, wherein a TCO layer (30) is disposed over an undercoating layer (20) that is disposed over a glass substrate (10).

A number of drawbacks for PV module manufacturers who purchase PV substrates can occur with deposition of the necessary semi-conducting thin film layers. Two of those drawbacks are the length of time needed to deposit the semi-conducting layers and the cost of depositing the semi-conducting layers. Regarding the length of time needed, PV module manufacturers typically take about two to about four hours (from start to finish) for the deposition of the semi-conducting layers. The production time of about two to about four hours includes, but is not limited to, the process steps of: loading of the purchased PV substrate onto a conveyor; washing and cleaning of the PV substrate while on the conveyor; re-heating and re-cooling of the PV substrate while on the conveyor to create optimal conditions for semi-conductor thin film layer deposition; and deposition of the semi-conductor thin film layers.

The inventors of the subject matter disclosed herein have surprisingly found that the semi-conducting thin film layers can be deposited during the on-line process. The choice of semi-conducting material is not particularly limited as long as the material is able to be deposited on-line. In embodiments of the present invention, it is preferred that metallic silicon be used for the necessary semi-conducting thin film layers.

Methods in accordance with the present invention can provide on-line produced PV module substrates of the general formula: A) glass substrate/UC/TCO/p-Si/i-Si/n-Si (p-i-n single junction); B) glass substrate/UC/TCO/p-Si/i-Si/n-Si/p-Si/i-Si/n-Si (p-i-n double junction); and C) glass substrate/UC/TCO/p-Si/i-Si/n-Si/p-Si/i-Si/n-Si/p-Si/i-Si/n-Si (p-i-n triple junction). It is noted that the single, double and triple junction p-i-n layers discussed herein are representative of the present invention. Those of skill in the art will know how to adapt the methods described herein for the production of PV module substrates that comprise more than three p-i-n junctions.

The methods in accordance with the present invention can also provide on-line produced PV module substrates of the general formula: A) glass substrate/UC/TCO/n-Si/i-Si/p-Si (n-i-p single junction); B) glass substrate/UC/TCO/n-Si/i-Si/p-Si/n-Si/i-Si/p-Si (n-i-p double junction); and C) glass substrate/UC/TCO/n-Si/i-Si/p-Si/n-Si/i-Si/p-Si/n-Si/i-Si/p-Si (n-i-p triple junction). It is noted that the single, double and triple junction n-i-p layers discussed herein are representative of the present invention. Those of skill in the art will know how to adapt the methods described herein for the production of PV module substrates that comprise more than three n-i-p junctions.

For the PV substrates described by methods of the present invention, while not necessary, it is preferable to dispose an undercoating below the transparent conductive oxide thin film such that the undercoating is positioned between the substrate and the transparent conductive oxide thin film.

For the undercoating layer of the present invention, while not particularly limited, it is preferable to use silicon oxide, silicon dioxide, silicon nitride, silicon oxynitride, silicon carbide, silicon oxycarbide and combinations thereof. For the undercoating layer of the present invention, it is most preferable to use a thin film of silicon oxycarbide as the undercoating.

For the TCO layer of the present invention, while not particularly limited, it is preferable to use tin oxide, fluorine-doped tin oxide (FTO), aluminum-doped zinc oxide (AZO) and indium tin oxide (ITO). For the TCO layer of the present invention, it is most preferable to use fluorine-doped tin oxide.

For the semi-conducting layers of the present invention, the choice of semi-conducting material is not particularly limited as long as the material is able to be pyrolytically deposited. Semi-conducting metals that are known to be able to be pyrolytically deposited are silicon, cadmium, tellurium, indium, gallium, arsenic, antimony, aluminum, zinc and combination thereof.

In embodiments of the present invention, it is preferable to use silicon. Silicon can be pyrolytically deposited from the starting material silane at elevated temperatures. For p-type silicon layers, combining a boron containing starting material with silane leads to a positively charged p-type silicon layer. For n-type silicon layers, combining a phosphorous containing starting material with silane leads to a negatively charged n-type silicon layer. For i-type silicon, no other chemical starting material is necessary outside of silane, as it is an un-doped silicon layer. Optionally, if desired, the i-Si layer can be passivated with hydrogen. This can be accomplished by combining the silane with hydrogen gas.

The following description provides a general method of providing a PV substrate in accordance with the present invention. The following description is intended to be non-limiting and modifications and variations of the generally described method can be adapted and changed for a desired final PV substrate by those of ordinary skill in the thin film coating arts, such changes still falling within the scope of the present invention.

Soda-lime silica glass can be made from well-known glass batch compositions. The glass batch composition can be melted by heating in a glass melting furnace and then directed to a tin bath of a float-line setup. In the case of casted glass, the melted glass is directed to either casting roller(s) or to casting mold(s). From a first coater positioned in the tin bath of a float-line, the undercoating layer can be deposited. In the case of casted glass, the coater is positioned downstream from either the casting roller(s) or the casting mold(s). From a second coater positioned downstream from the first coater, the transparent conductive oxide thin film layer can be deposited.

From a third coater positioned downstream from the second coater, an n-Si or a p-Si layer can be pyrolytically deposited onto the PV substrate containing an undercoating and a transparent conductive oxide layer.

If an n-Si layer is desired to be produced from the third coater, a mixed gas stream containing silane ($SiH_4$) and a dopant can be directed to a heated surface of the glass ribbon for creation and deposition of an n-Si thin film layer. The dopant most frequently used for fabrication of n-Si layers is a Group V element, such as phosphorous. The choice of phosphorous containing starting materials for doping of n-Si layers includes, but is not limited to, trimethyl phosphate, triethyl phosphate, tripropyl phosphate, tributyl phosphate, tri-t-butyl phosphate and phosphine. It is preferred to use phosphine for doping of the n-Si layers of the present invention. The gases of the mixed gas stream included for each of the aforementioned starting materials can be supplied at the following rate ranges: 1) silane ($SiH_4$) 0.0-50.0 g/min; and 2) phosphine ($PH_3$) 0.0-25.0 g/min. Preferred ranges for starting material delivery is: 1) silane ($SiH_4$) 0.5-30.0 g/min; and 2) phosphine ($PH_3$) 0.5-15.0 g/min. When desired, such n-Si layers in accordance with the present invention can be passivated with hydrogen by inclusion of hydrogen gas in the mixed gas stream of starting materials. The hydrogen gas can be supplied at the rate range of 0.0-20.0 g/min. A preferred range of hydrogen gas can be supplied at the rate range of 0.5-10 g/min.

If a p-Si layer is desired to be produced from the third coater, a mixed gas stream containing silane ($SiH_4$) and a dopant can be directed to a heated surface of the glass ribbon for creation and deposition of a p-Si thin film layer. The dopant most frequently used for fabrication of p-Si layers is a Group III element, such as boron. The choice of boron containing starting materials for doping of p-Si layers include, but is not limited to, diborane, boron tribromide, boron trichloride, boron trifluoride and boron triiodide. It is preferred to use diborane for doping of the p-Si layers of the present invention. The gases of the mixed gas stream included for each of the aforementioned starting materials can be supplied at the following rate ranges: 1) silane ($SiH_4$) 0.0-50.0 g/min; and 2) diborane ($B_2H_6$) 0.0-25.0 g/min. Preferred ranges for starting material delivery is: 1) silane ($SiH_4$) 0.5-30.0 g/min; and 2) diborane ($B_2H_6$) 0.5-15.0 g/min. When desired, such p-Si layers in accordance with the present invention can be passivated with hydrogen by inclusion of hydrogen gas in the mixed gas stream of starting materials. The hydrogen gas can be supplied at the rate range of 0.0-20.0 g/min. A preferred range of hydrogen gas can be supplied at the rate range of 0.5-10 g/min.

From a fourth coater positioned downstream from the third coater, an n-Si or a p-Si layer can be pyrolytically deposited onto the PV substrate. The choice of either an n-Si layer or a p-Si layer being produced from the fourth coater will depend upon which type of silicon layer was deposited on the PV substrate from the third coater. If an n-Si layer was produced at the third coater, a p-Si layer can be produced from the fourth coater as described above. If a p-Si layer was produced at the third coater, an n-Si layer can be produced from the fourth coater as described above.

When i-Si semi-conductor thin film layers are necessary to incorporate between the n-Si and p-Si layers, as is the case for amorphous and crystalline silicon based PV modules, another coater can be positioned in between the third and fourth coaters for the deposition for producing such i-Si layers. If an i-Si layer is desired to be produced, a gas stream containing silane ($SiH_4$) can be directed to a heated surface of the glass ribbon for creation and deposition of an i-Si thin film layer. Silane gas can be supplied at the rate range of 0.0-50.0 g/min. A preferred range of silane gas can be supplied at a rate range of 0.5-30.0 g/min. If desired, the i-Si layer can be passivated with hydrogen. To accomplish this, hydrogen gas can be combined with the silane starting material at the following rate range: 0.0-20.0 g/min. A preferred range of hydrogen gas can be supplied at the rate range of 0.5-10 g/min.

Generally, there is no limit on the number of coaters that can be positioned on the float-line downstream of a float bath, as long as there is sufficient space on the float-line for disposition of such coaters. Similarly, there is no limit on the number of coaters that can be positioned on the casted glass line downstream of the casting roller(s) or casting mold(s), as long as there is sufficient space for disposition of such coaters. However, the number of coaters that can be potentially positioned downstream will be limited by the length of the line used for producing the molten glass ribbon. Those of skill in the art will recognize how to build and incorporate the coating apparatus and equipment either inside of a tin bath or downstream of a tin bath or downstream of the casting roller(s) or casting mold(s). While the embodiment of the present invention of the above general description encompasses the coating structure of a single-junction p-(i-)n type PV substrate, those of skill in the art will also recognize how to build and incorporate additional coaters that would be needed to produce double-, triple- and multi-junction p-(i-)n type PV substrates. Similarly, those of skill in the art will recognize the adaptations needed to produce single-, double-, triple- and multi-junction n-(i-)p type PV substrates.

The inventors of the present invention have surprisingly found that it is possible to deposit the semi-conducting layers in vastly shorter amounts of time when compared to that of PV module manufacturers. This is attributed to performing the deposition step on-line. Typically, it may take PV module manufacturers anywhere from two to four hours to produce semi-conducting layers. Incorporation of deposition techniques for on-line production of semi-conducting metal layers eliminates the need for PV module manufacturers to produce such layers. Thus, costs incurred by the PV module manufacturers can be dramatically reduced. Moreover, the inventors have found that it is possible to deposit semi-conducting layers in a matter of minutes, if not seconds. It is preferable for the deposition steps described herein to be pyrolytic deposition steps.

Furthermore, the inventors of the present invention have found that on-line deposition of semi-conducting layers offers the advantage of depositing the layers on a continuous ribbon of glass. This, in turn, leads to a higher quality film because the semiconducting layers do not suffer from edge effects. The methods of the present invention also allow for a reduced cost for starting materials and improved coating efficiency when compared to off-line sputtering processes often utilized by PV module manufacturers.

The methods of the present invention impart features that are attractive to PV module manufacturers who wish to purchase PV substrates fabricated by the inventive methods described herein. Such features make the PV semi-conducting layers desirable as a "value added" product and include: 1) the elimination of the need for PV module manufacturers to wash and clean the PV substrate prior to silicon layer deposition; 2) the elimination of the need for PV module manufacturers to re-heat and re-cool the PV substrate for semi-conducting layer deposition; and 3) the elimination of the need for PV module manufacturers to deposit, or sputter, the semi-conducing layers. The elimination of these process steps translates into a dramatically reduced cost for PV module manufacturers.

EXAMPLE 1

Figure 2:
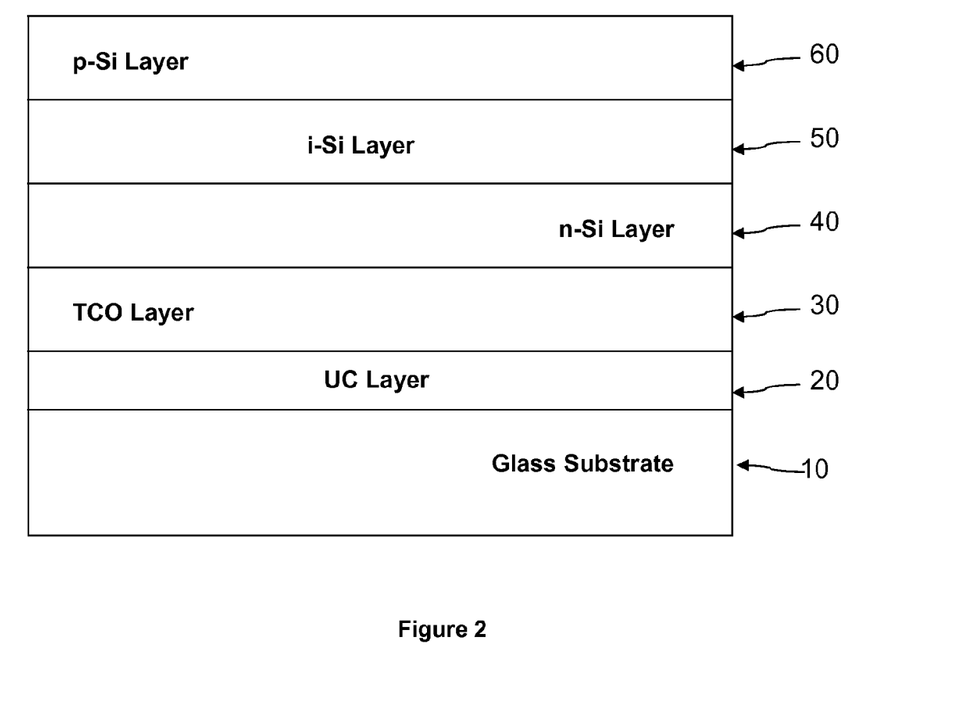
FIG. 2 shows the structure of single-junction p-i-n type silicon layers disposed on a PV substrate in accordance with the present invention.

The following example describes an on-line method of making a PV substrate with a p-i-n coating in accordance with the present invention and as embodied by FIG. 2, which represents a p-i-n silicon single junction PV substrate.

From a first coater positioned inside a float bath, a mixed gas stream is directed to a heated surface of the glass ribbon substrate 10 to form the undercoating layer 20.

From a second coater positioned downstream from a first coater, a mixed gas stream is directed to a surface of the undercoating layer 20 to form TCO layer 30.

From a third coater positioned downstream from the second coater, a mixed gas stream is directed to a surface of TCO layer 30 to form n-Si layer 40.

From a fourth coater positioned downstream from the third coater, a mixed gas stream is directed to a surface of n-Si layer 40 to form i-Si layer 50.

From a fifth coater positioned downstream from the fourth coater, a mixed gas stream is directed to a surface of i-Si layer 50 to form p-Si layer 60.

EXAMPLE 2

Figure 3:
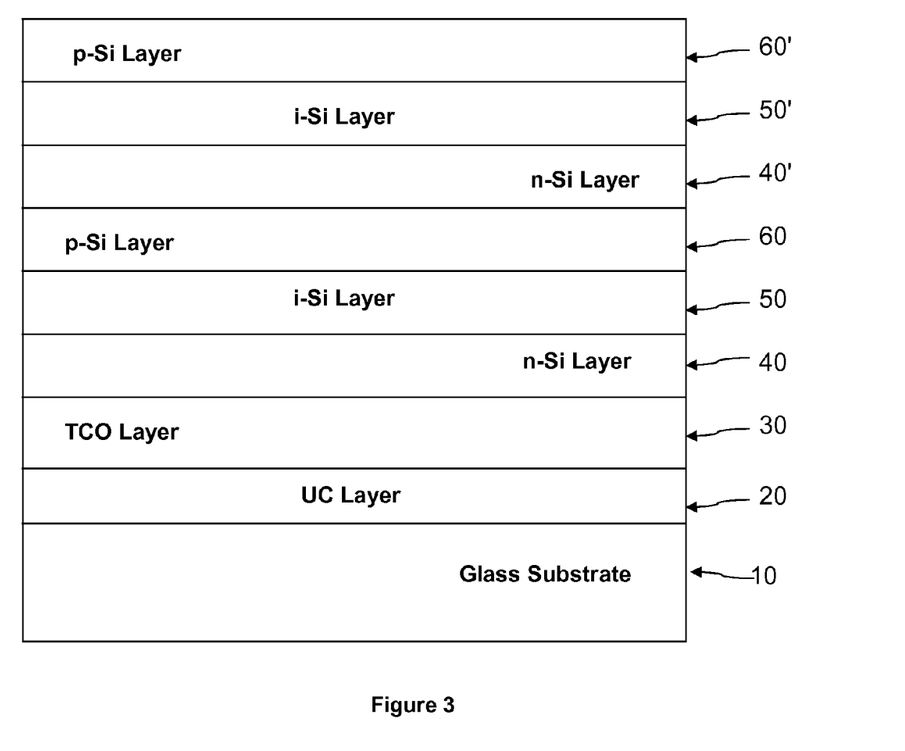
FIG. 3 shows the structure of double-junction p-i-n type silicon layers disposed on a PV substrate in accordance with the present invention.

The following example describes an on-line method of making a PV substrate in accordance with the present invention and as embodied by FIG. 3, which represents a p-i-n silicon double junction PV substrate.

From a first coater positioned inside a float bath, a mixed gas stream is directed to a heated surface of the glass ribbon substrate 10 to form the undercoating layer 20.

From a second coater positioned downstream from a first coater, a mixed gas stream is directed to a surface of the undercoating layer 20 to form TCO layer 30.

From a third coater positioned downstream from the second coater, a mixed gas stream of is directed to a surface of TCO layer 30 to form n-Si layer 40.

From a fourth coater positioned downstream from the third coater, a mixed gas stream is directed to a surface of n-Si layer 40 to form i-Si layer 50.

From a fifth coater positioned downstream from the fourth coater, a mixed gas stream is directed to a surface of i-Si layer 50 to form p-Si layer 60.

From a sixth coater positioned downstream from the fifth coater, a mixed gas stream is directed to a surface of p-Si layer 60 to form n-Si layer 40'.

From a seventh coater positioned downstream from the sixth coater, a mixed gas stream directed to a surface of n-Si layer 40' to form i-Si layer 50'.

From an eighth coater positioned downstream from the seventh coater, a mixed gas stream is directed to a surface of i-Si layer 50' to form p-Si layer 60'.

EXAMPLE 3

Figure 4:
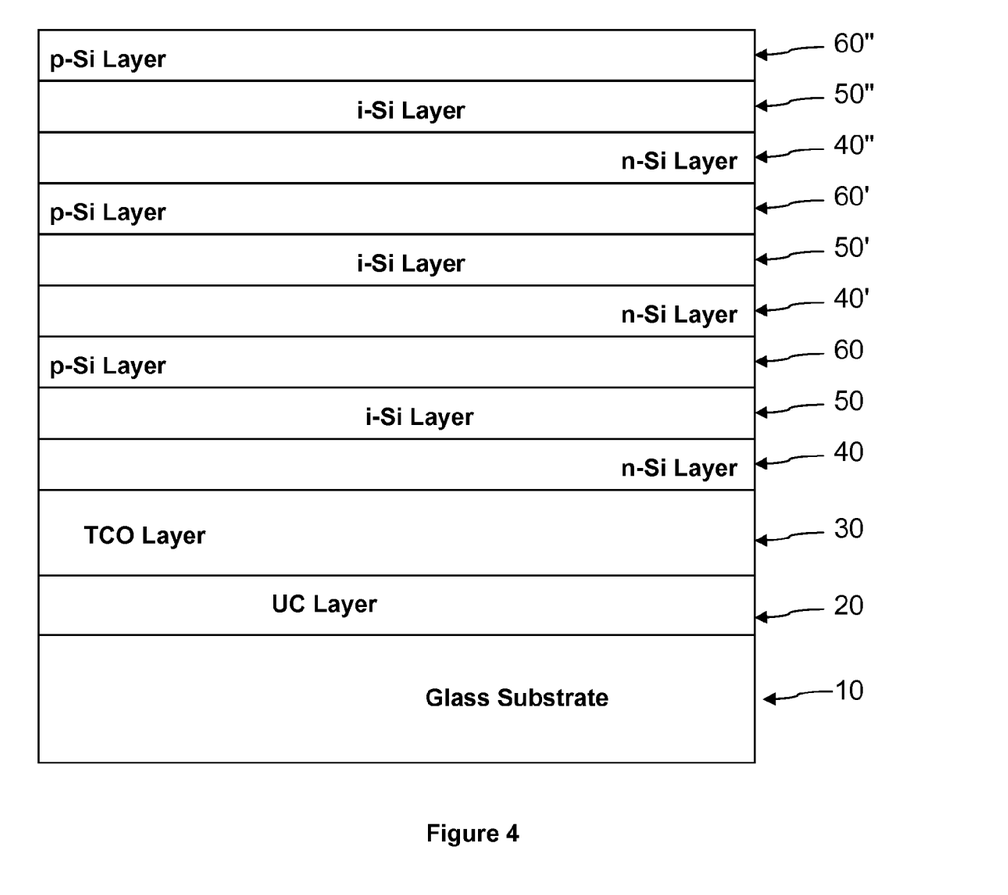
FIG. 4 shows the structure of triple-junction p-i-n type silicon layers disposed on a PV substrate in accordance with the present invention.

The following example describes an on-line method of making a PV substrate in accordance with the present invention and as embodied by FIG. 4, which represents a p-i-n silicon triple junction PV substrate.

From a first coater positioned inside a float bath, a mixed gas stream is directed to a heated surface of the glass ribbon substrate 10 to form the undercoating layer 20.

From a second coater positioned downstream from a first coater, a mixed gas stream is directed to a surface of the undercoating layer 20 to form TCO layer 30.

From a third coater positioned downstream from the second coater, a mixed gas stream is directed to a surface of TCO layer 30 to form n-Si layer 40.

From a fourth coater positioned downstream from the third coater, a mixed gas stream is directed to a surface of n-Si layer 40 to form i-Si layer 50.

From a fifth coater positioned downstream from the fourth coater, a mixed gas stream is directed to a surface of i-Si layer 50 to form p-Si layer 60.

From a sixth coater positioned downstream from the fifth coater, a mixed gas stream is directed to a surface of p-Si layer 60 to form n-Si layer 40'.

From a seventh coater positioned downstream from the sixth coater, a mixed gas stream is directed to a surface of n-Si layer 40' to form i-Si layer 50'.

From an eighth coater positioned downstream from the seventh coater, a mixed gas stream is directed to a surface of i-Si layer 50' to form p-Si layer 60'.

From a ninth coater positioned downstream from the eighth coater, a mixed gas stream is directed to a surface of p-Si layer 60' to form n-Si layer 40".

From a tenth coater positioned downstream from the ninth coater, a mixed gas is directed to a surface of n-Si layer 40" to form i-Si layer 50".

From an eleventh coater positioned downstream from the tenth coater, a mixed gas stream is directed to a surface of i-Si layer 50" to form p-Si layer 60".

EXAMPLE 4

Figure 5:
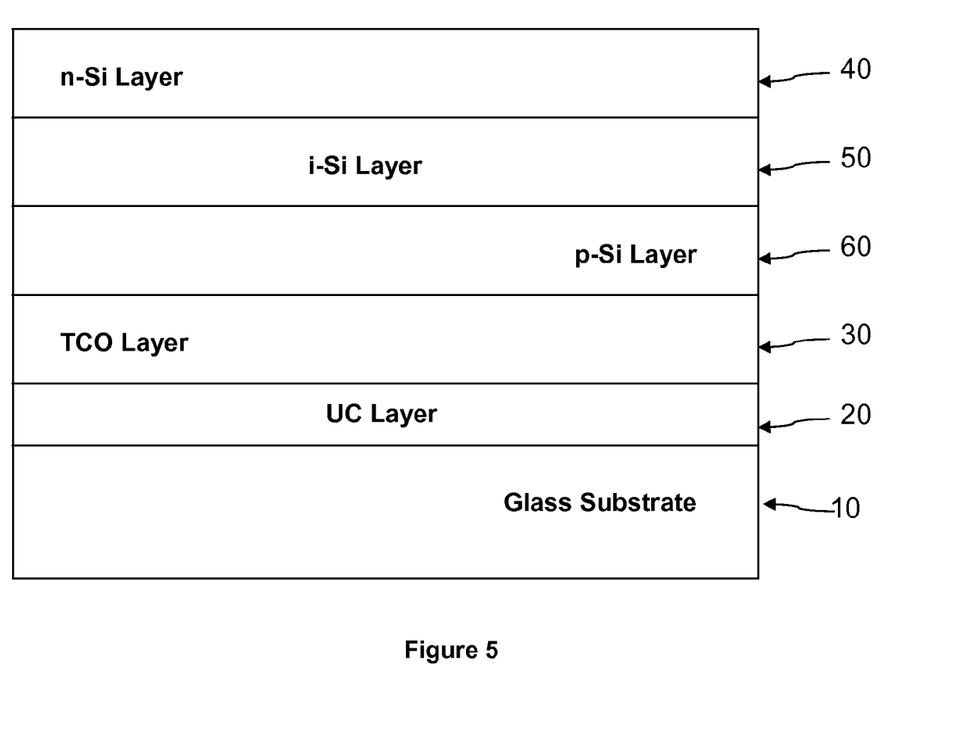
FIG. 5 shows the structure of single-junction n-i-p type silicon layers disposed on a PV substrate in accordance with the present invention.

The following example describes an on-line method of making a PV substrate in accordance with the present invention and as embodied by FIG. 5, which represents a p-i-n silicon single junction PV substrate.

From a first coater positioned inside a float bath, a mixed gas stream is directed to a heated surface of the glass ribbon substrate 10 to form the undercoating layer 20.

From a second coater positioned downstream from a first coater, a mixed gas stream is directed to a surface of the undercoating layer 20 to form TCO layer 30.

From a third coater positioned downstream from the second coater, a mixed gas stream is directed to a surface of TCO layer 30 to form p-Si layer 60.

From a fourth coater positioned downstream from the third coater, a mixed gas stream is directed to a surface of p-Si layer 60 to form i-Si layer 50.

From a fifth coater positioned downstream from the fourth coater, a mixed gas stream is directed to a surface of i-SI layer 50 to form n-Si layer 40.

EXAMPLE 5

Figure 6:
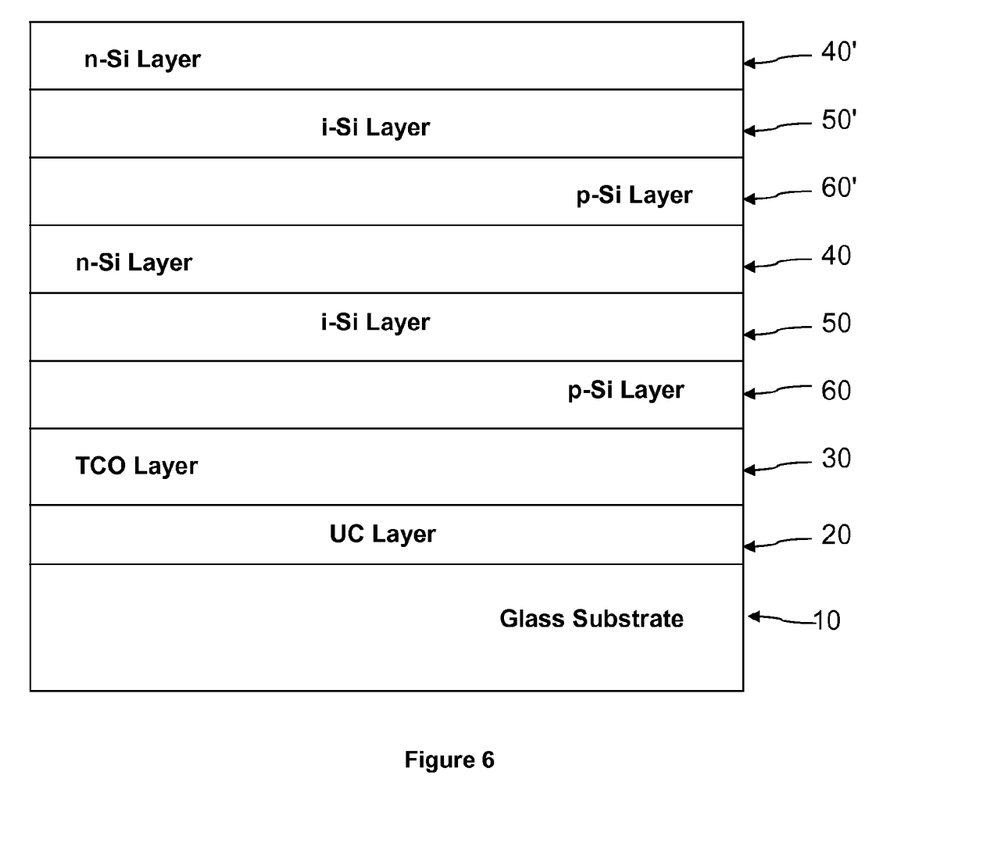
FIG. 6 shows the structure of double-junction n-i-p type silicon layers disposed on a PV substrate in accordance with the present invention.

The following example describes an on-line method of making a PV substrate in accordance with the present invention and as embodied by FIG. 6, which represents a p-i-n silicon double junction PV substrate.

From a first coater positioned inside a float bath, a mixed gas stream is directed to a heated surface of the glass ribbon substrate 10 to form the undercoating layer 20.

From a second coater positioned downstream from a first coater, a mixed gas stream is directed to a surface of the undercoating layer 20 to form TCO layer 30.

From a third coater positioned downstream from the second coater, a mixed gas stream is directed to a surface of TCO layer 30 to form p-Si layer 60.

From a fourth coater positioned downstream from the third coater, a mixed gas stream is directed to a surface of p-Si layer 60 to form i-Si layer 50.

From a fifth coater positioned downstream from the fourth coater, a mixed gas stream is directed to a surface of i-SI layer 50 to form n-Si layer 40.

From a sixth coater positioned downstream from the fifth coater, a mixed gas stream is directed to a surface of n-Si layer 40 to form p-Si layer 60'.

From a seventh coater positioned downstream from the sixth coater, a mixed gas stream is directed to a surface of p-Si layer 60' to form i-Si layer 50'.

From an eighth coater positioned downstream from the seventh coater, a mixed gas stream is directed to a surface of i-SI layer 50' to form n-Si layer 40'.

EXAMPLE 6

Figure 7:
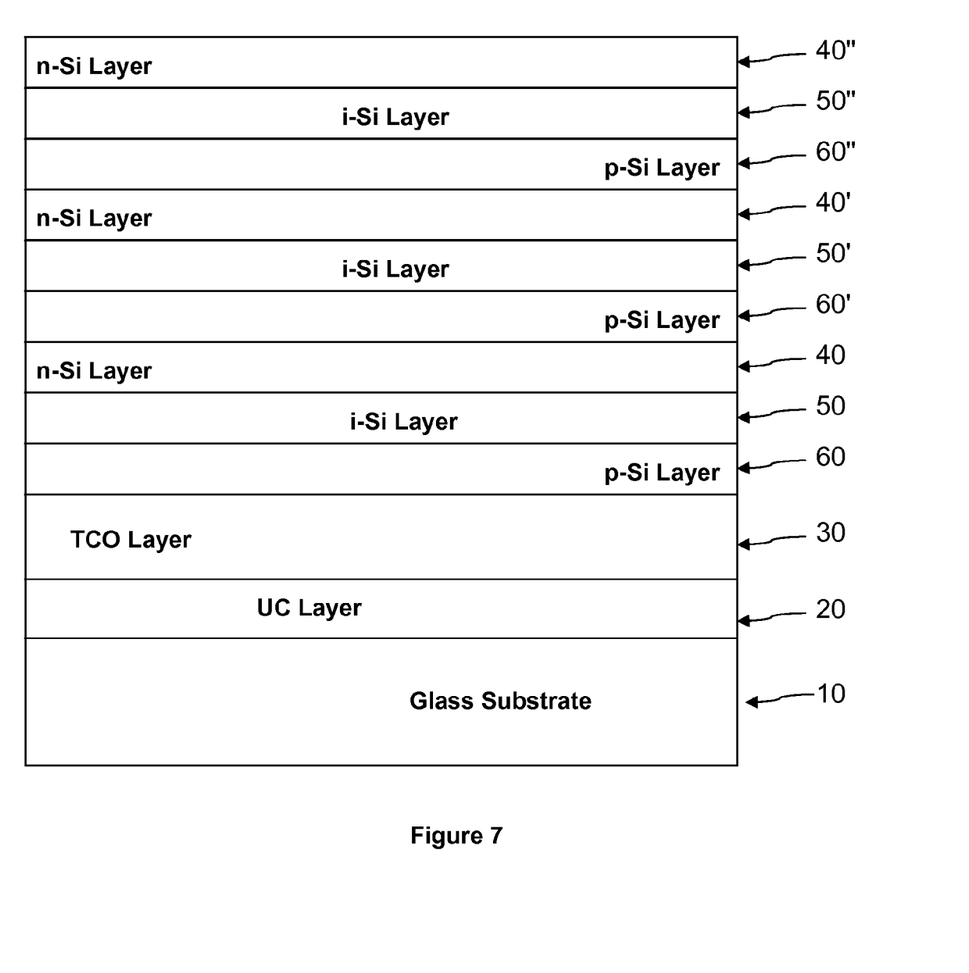
FIG. 7 shows the structure of triple-junction n-i-p type silicon layers disposed on a PV substrate in accordance with the present invention.

The following example describes an on-line method of making a PV substrate in accordance with the present invention and as embodied by FIG. 7, which represents a p-i-n silicon triple junction PV substrate. From a first coater positioned inside a float bath, a mixed gas stream is directed to a heated surface of the glass ribbon substrate 10 to form the undercoating layer 20.

From a second coater positioned downstream from a first coater, a mixed gas stream is directed to a surface of the undercoating layer 20 to form TCO layer 30.

From a third coater positioned downstream from the second coater, a mixed gas stream is directed to a surface of TCO layer 30 to form p-Si layer 60.

From a fourth coater positioned downstream from the third coater, a mixed gas stream is directed to a surface of p-Si layer 60 to form i-Si layer 50.

From a fifth coater positioned downstream from the fourth coater, a mixed gas stream is directed to a surface of i-Si layer 50 to form n-Si layer 40.

From a sixth coater positioned downstream from the fifth coater, a mixed gas stream of is directed to a surface of n-Si layer 40 to form p-Si layer 60'.

From a seventh coater positioned downstream from the sixth coater, a mixed gas stream of is directed to a surface of p-Si layer 60' to form i-Si layer 50'.

From an eighth coater positioned downstream from the seventh coater, a mixed gas is directed to a surface of i-SI layer 50' to form n-Si layer 40'.

From a ninth coater positioned downstream from the eighth coater, a mixed gas stream is directed to a surface of n-Si layer 40' to form p-Si layer 60".

From a tenth coater positioned downstream from the ninth coater, a mixed gas stream is directed to a surface of p-Si layer 60" to form i-Si layer 50".

From an eleventh coater positioned downstream from the tenth coater, a mixed gas stream of is directed to a surface of i-SI layer 50" to form n-Si layer 40".

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A method of producing a coated glass substrate on either a float-line or a casted glass line with one or more coaters positioned on-line comprising:
   a) melting batch materials in a furnace to form molten glass;
   b) selecting one of: 1) floating a continuous stream of molten glass onto a bath of molten tin of a float line to form a glass sheet or 2) casting a continuous stream of molten glass through casting rolls or casting molds of a casting glass line to form a sheet of glass; and
   c) depositing, from a first coater positioned on-line, a semi-conducting metal layer on a portion of the sheet of glass.

2. The method according to claim 1, wherein the semi-conducting metal layer is selected from the group consisting of silicon, cadmium, tellurium, indium, gallium, arsenic, antimony, aluminum, zinc and combinations thereof.

3. The method according to claim 1, wherein the semi-conducting metal layer is silicon.

4. The method according to claim 3, wherein the silicon is p-type silicon.

5. The method according to claim 4, wherein the p-type silicon is doped with a Group III element and, optionally, passivated with hydrogen.

6. The method according to claim 5, wherein the Group III element is boron.

7. The method according to claim 3, wherein the silicon is n-type silicon.

8. The method according to claim 7, wherein the n-type silicon is doped with a Group V element and, optionally, passivated with hydrogen.

9. The method according to claim 8, wherein the Group V element is phosphorous.

10. The method according to claim 3, wherein the silicon is i-type silicon that is optionally passivated with hydrogen.

11. The method according to claim 3, wherein the semi-conducting metal layer is comprised of amorphous silicon or crystalline silicon.

12. The method according to claim 11, wherein the crystalline silicon is selected from the group consisting of nano-crystalline silicon, micro-crystalline silicon, poly-crystalline silicon, mono-crystalline silicon and combinations thereof.

13. The method according to claim 1, wherein the glass substrate is at a temperature of between about 200° C. and about 800° C. during the deposition of the semi-conducting metal layer.

14. The method according to claim 13, wherein the glass substrate is at a temperature of between about 400° C. and about 780° C.

15. The method according to claim 1, further comprising depositing, from a second coater positioned on-line and upstream from the first coater, an undercoating layer between the glass substrate and the semi-conducting metal layer.

16. The method according to claim 15, wherein the undercoating is selected from the group consisting of silicon oxide, silicon dioxide, silicon nitride, silicon oxynitride, silicon carbide, silicon oxycarbide and combinations thereof.

17. The method according to claim 1, further comprising depositing, from a second coater positioned on-line and upstream from the first coater, a transparent conductive oxide layer between the glass substrate and the semi-conducting metal layer.

18. The method according to claim 17, wherein the transparent conductive oxide layer is selected from the group consisting of tin oxide, fluorine-doped tin oxide, aluminum-doped zinc oxide and indium tin oxide.

19. The method according to claim 17, further comprising depositing, from a fifth coater positioned on-line and downstream from the second coater and upstream from the first coater, an interfacial layer on a portion of the transparent conductive oxide layer.

20. The method according to claim 19, wherein the interfacial layer comprises oxides of titanium, oxides of zinc, and combinations thereof.

21. The method according to claim 1, wherein the depositing the at least one semi-conducting metal layer on the glass substrate comprises pyrolytically depositing the at least one semi-conducting metal layer on the glass substrate.

22. The method according to claim 1, wherein the deposition of the semi-conducting metal layer in step e) is completed in less than two hours.

23. A method of producing a coated glass substrate on either a float-line or a casted glass line with one or more coaters positioned on-line, comprising:
   a) melting batch materials in a furnace to form molten glass;
   b) selecting one of: 1) floating a continuous stream of molten glass onto a bath of molten tin of a float line to form a sheet of glass or 2) casting a continuous stream of molten glass through casting rolls or casting molds of a casting glass line to form a sheet of glass;
   c) depositing, a first coater positioned on-line, a semi-conducting metal layer on a portion of the sheet of glass, wherein the semi-conducting metal layer is selected from the group consisting of n-type silicon and p-type silicon;
   d) optionally, depositing, from a second coater positioned on-line and downstream from the first coater of step c), a semi-conducting metal layer comprising i-type silicon on the metal layer of step c);
   e) depositing, from a third coater positioned on-line and downstream from the first coater of step c) and/or the second coater of step d), a semi-conducting metal layer on the metal layer of step c) or d), wherein the metal layer comprising silicon is selected from the group consisting of n-type silicon and p-type silicon; and
   f) optionally, repeating steps c)-e) to form additional p-(i-)n or n-(i-)p silicon layers on the glass substrate.

24. The method according to claim 23, wherein the p-type silicon is doped with a Group III element and, optionally, passivated with hydrogen.

25. The method according to claim 24, wherein the Group III element is boron.

26. The method according to claim 23, wherein the n-type silicon is doped with a Group V element and, optionally, passivated with hydrogen.

27. The method according to claim 26, wherein the Group V element is phosphorous.

28. The method according to claim 23, wherein the i-type silicon is optionally passivated with hydrogen.

29. The method according to claim 23, wherein the glass substrate is at a temperature of between about 200° C. and about 800° C. during the deposition of steps c)-e).

30. The method according to claim 29, wherein the glass substrate is at a temperature of between about 400° C. and about 780° C. during the deposition of steps c)-e).

31. The method according to claim 23, further comprising depositing, from a fourth coater positioned on-line and upstream from the first coater, an undercoating layer between the glass substrate and the metal layer of step c).

32. The method according to claim 31, wherein the undercoating is selected from the group consisting of silicon oxide, silicon dioxide, silicon nitride, silicon oxynitride, silicon carbide, silicon oxycarbide and combinations thereof.

33. The method according to claim 23, further comprising depositing, from a fourth coater positioned on-line and upstream from the first coater, a transparent conductive oxide layer between the glass substrate and the metal layer of step c).

34. The method according to claim 33, wherein the transparent conductive oxide layer is selected from the group consisting of tin oxide, fluorine-doped tin oxide, aluminum-doped zinc oxide and indium tin oxide.

35. The method according to claim 33, further comprising depositing, from a fifth coater positioned on-line and downstream from the fourth coater and upstream from the first coater, an interfacial layer on a portion of the transparent conductive oxide layer.

36. The method according to claim 35, wherein the interfacial layer comprises oxides of titanium, oxides of zinc, and combinations thereof.

37. The method according to claim 23, wherein step f) is repeated once to produce a double-junction p-(i-)n or n-(i-)p type silicon photovoltaic substrate.

38. The method according to claim 23, wherein step f) is repeated twice to produce a triple-junction p-(i-)n or n-(i-)p type silicon photovoltaic substrate.

39. The method according to claim 23, wherein step f) is repeated multiple times to produce a multi-junction type p-(i-)n or n-(i-)p type silicon photovoltaic substrate.

40. The method according to claim 23, wherein steps c)-f) comprise pyrolytically depositing the layers produced by steps c)-f).

41. The method according to claim 23, wherein the p-(i-)n or n-(i-)p type silicon layers are comprised of amorphous silicon or crystalline silicon.

42. The method according to claim 41, wherein the crystalline silicon is selected from the group consisting of nano-crystalline silicon, micro-crystalline silicon, poly-crystalline silicon, mono-crystalline silicon and combinations thereof.

43. The method according to claim 23, wherein the deposition of the semi-conducting metal layers in steps e)-h) is completed in less than two hours.

44. A method of producing a coated glass substrate on either a float-line or a casted glass line with one or more coaters positioned on-line, comprising:
   a) melting batch materials in a furnace to form molten glass;
   b) selecting one of: 1) floating a continuous stream of molten glass onto a bath of molten tin to form a sheet of glass or 2) casting a continuous stream of molten glass through casting rolls or casting molds of a casting glass line to form a sheet of glass;
   c) depositing, from a first coater positioned on-line, an undercoating disposed on the glass substrate;
   d) depositing, from a second coater positioned on-line and downstream of the first coater of step c), a transparent conductive oxide layer disposed on the undercoating;
   e) depositing, from a third coater positioned on-line and downstream from the second coater of step d), a semi-conducting metal layer on the transparent conductive oxide layer, wherein the semi-conducting metal layer is selected from the group consisting of n-type silicon and p-type silicon;
   f) optionally, depositing, from a fourth coater positioned on-line and downstream from the third coater of step e), a semi-conducting metal layer comprising i-type silicon on the metal layer of step c);
   g) depositing, from a coater positioned on-line and downstream from the third coater of step e) or the fourth coater of step f), a semi-conducting metal layer on the metal layer of step e) or f), wherein the semi-conducting metal layer is selected from the group consisting of n-type silicon and p-type silicon; and
   h) optionally, repeating steps e)-g) to form additional p-(i-)n or n-(i-)p silicon layers on the glass substrate.

45. The method according to claim 44, wherein the p-type silicon is doped with a Group III element and, optionally, passivated with hydrogen.

46. The method according to claim 45, wherein the Group III element is boron.

47. The method according to claim 44, wherein the n-type silicon is doped with a Group V element and, optionally, passivated with hydrogen.

48. The method according to claim 47, wherein the Group V element is phosphorous.

49. The method according to claim 44, wherein the i-type silicon is optionally passivated with hydrogen.

50. The method according to claim 44, wherein the glass substrate is at a temperature of between about 200° C. and about 800° C. during the deposition of steps c)-h).

51. The method according to claim 50, wherein the glass substrate is at a temperature of between about 400° C. and about 780° C. during the deposition of steps c)-h).

52. The method according to claim 44, wherein the undercoating is selected from the group consisting of silicon oxide, silicon dioxide, silicon nitride, silicon oxynitride, silicon carbide, silicon oxycarbide and combinations thereof.

53. The method according to claim 44, wherein the transparent conductive oxide layer is selected from the group consisting of tin oxide, fluorine-doped tin oxide, aluminum-doped zinc oxide and indium tin oxide.

54. The method according to claim 44, wherein step f) is repeated once to produce a double-junction p-(i-)n or n-(i-)p type silicon photovoltaic substrate.

55. The method according to claim 44, wherein step f) is repeated twice to produce a triple-junction p-(i-)n or n-(i-)p type silicon photovoltaic substrate.

56. The method according to claim 44, wherein step f) is repeated multiple times to produce a multi-junction p-(i-)n or n-(i-)p type silicon photovoltaic substrate.

57. The method according to claim 44, wherein the depositing of steps c)-h) comprises pyrolytically depositing the layers produced by steps c)-h).

58. The method according to claim 44, wherein the p-(i-)n or n-(i-)p silicon layers are comprised of amorphous silicon or crystalline silicon.

59. The method according to claim 58, wherein the crystalline silicon is selected from the group consisting of nano-crystalline silicon, micro-crystalline silicon, poly-crystalline silicon, mono-crystalline silicon and combinations thereof.

60. The method according to claim 44, further comprising depositing, from a fifth coater positioned on-line and downstream from the second coater and upstream from the third coater, an interfacial layer on a portion of the transparent conductive oxide layer.

61. The method according to claim 60, wherein the interfacial layer comprises oxides of titanium, oxides of zinc, and combinations thereof.

62. The method according to claim 44, wherein the deposition of the semi-conducting metal layers in steps f)-i) is completed in less than two hours.

* * * * *